United States Patent [19]

Mauduit et al.

[11] 4,360,775
[45] Nov. 23, 1982

[54] MACHINE FOR TESTING PLANAR MAGNETIC FILM WITH MAGNETIC BUBBLES

[75] Inventors: Daniel Mauduit, Rives sur Fure; Georges Sauron, Meylan, both of France

[73] Assignee: Commissariat a l'Energie Atomique, Paris, France

[21] Appl. No.: 154,145

[22] Filed: May 29, 1980

[30] Foreign Application Priority Data

Jun. 1, 1979 [FR] France .................... 79 14126

[51] Int. Cl.³ ................ G01R 33/12; G11C 19/08
[52] U.S. Cl. ............................ 324/210; 365/1
[58] Field of Search ............... 324/210, 211, 212; 365/1, 2, 27, 28

[56] References Cited

U.S. PATENT DOCUMENTS 3,219,922 11/1965 James et al. ............... 324/210
3,254,298 5/1966 Ellis et al. ................ 324/210
3,987,363 10/1976 Roos et al. ................ 324/210
4,213,091 7/1980 Cooper ..................... 324/210

*Primary Examiner*—Gerald R. Strecker
*Assistant Examiner*—Walter E. Snow
*Attorney, Agent, or Firm*—Pearne, Gordon, Sessions, McCoy & Granger

[57] ABSTRACT

Machine for testing planar magnetic film with magnetic bubbles and which comprises a testing device and a magnetic head, wherein the magnetic head incorporates two polarization coils in the Helmholtz position and whereof the common axis is normal to the plane of the magnetic film and two flat coils whose axes are perpendicular to one another and parallel to the plane of the magnetic film, the first of the polarization coils being arranged within the flat coils which are themselves arranged one within the other and on the same side of the magnetic film, while the test device and the second polarization coil are arranged on the other side of the magnetic film.

9 Claims, 1 Drawing Figure

U.S. Patent   Nov. 23, 1982   4,360,775
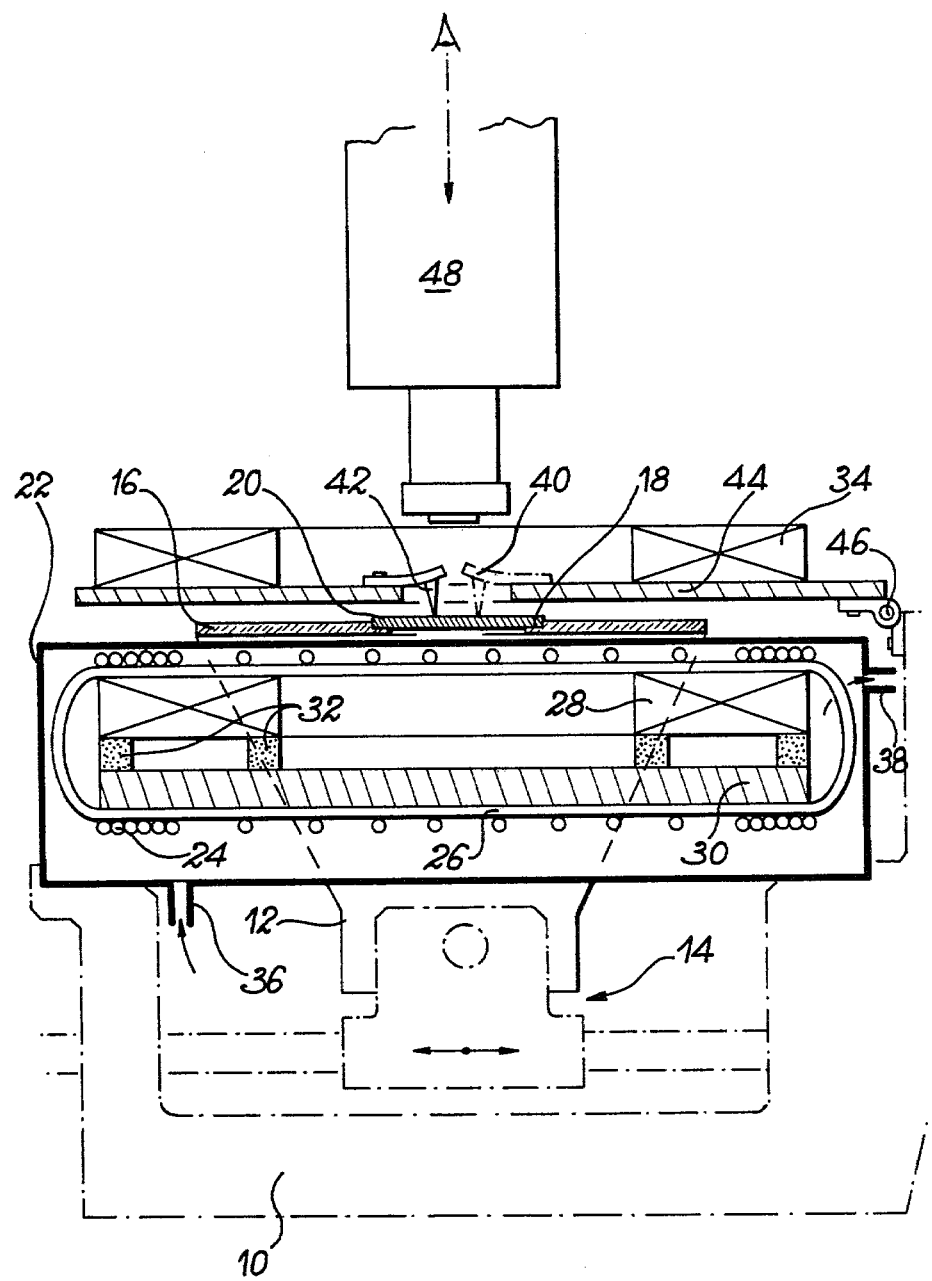

MACHINE FOR TESTING PLANAR MAGNETIC FILM WITH MAGNETIC BUBBLES

BACKGROUND OF THE INVENTION

The invention relates to a machine for testing elements having magnetic bubbles, such as memories, as well as to a testing method using such a machine.

It is pointed out that conventionally the term "bubbles" is used to describe generally cylindrical magnetic domains created in a planar magnetic film defining a monocrystalline layer having a uniaxial magnetic anisotropy perpendicular to the plane of the layer. The magnetic induction of these cylindrical domains has a direction opposite to that which it has in the remainder of the layer. These magnetic domains have the special feature of being displaceable in the layer when the latter is coated with magnetizable metallic designs or patterns (for example of permaloy) ensuring the guidance of the magnetic domain. The stability of the bubbles results from the application of a polarization field parallel to the magnetization direction of the magnetic film, i.e. perpendicular to the plane of said film. The displacement of these domains is obtained by means of a rotary field parallel to said plane by means of which the metallic patterns formed on the magnetic film are magnetized in such a way that the magnetic domains are positioned at the point where the vertical component of the stray field is at a maximum and of opposite direction to the polarization field and can be displaced by rotating said field in such a way as to modify the magnetic poles formed on the magnetized metallic patterns.

In this way it is possible to produce logic circuits, comparators, memories, etc.

As in all electronic components elements having magnetic bubbles must be tested after manufacture so that it is possible to check their performances and detect possible manufacturing faults.

A machine for testing components with magnetic bubbles must have a magnetic head making it possible to create the polarization field and rotary field necessary for the operation of the element to be tested, as well as an actual test device permitting the application of voltages and the circulation of the necessary currents, whilst also making it possible to carry out the necessary measurements and observations.

At present several different machines are known for testing elements having magnetic bubbles of this type. However, none of these machines permits the continuous testing of elements with magnetic bubbles of medium or large size, due to the often contradictory conditions imposed by the magnetic characteristics of the magnetic head and by the mechanical constraints linked more particularly with the accessibility of the tested magnetic film and arrangement of the test device with respect to the magnetic head.

Thus, the magnetic head must simultaneously supply a continuous polarization field normal to the plane of the magnetic film between 100 and 300 oe and a rotary field located in the plane of the magnetic field and of frequency between 1 and 200 kHz, and amplitude between 10 and 70 oe.

The creation of the polarization field causes few problems and can easily be attained by means of two coils arranged in the Helmholtz position. However, it is more difficult to create the rotary field. Thus, the rotary field is created by means of two pairs of coils energized by two sinusoidal currents dephased by $\pi/2$ and which cannot be placed in the Helmholtz position. This makes it impossible to create a homogeneous rotary field in the volume of the magnetic film to be tested. Moreover, the choke of the coil supplying the rotary field increases in size and importance in proportion to the frequency of the said field, which very rapidly limits the size of the coils or the working frequency. Furthermore the rotary field supplied by the coils has, in addition to the component located in the plane of the magnetic film, a component normal to said plane which disturbs the operation of the element to be tested.

Due to the non-homogeneous nature of the rotary field supplied by the magnetic head, in order to take account of the difficulties inherent in the creation of the rotary field and to reconcile them with the resulting mechanical consequences with regard to the position of the magnetic head coils relative to the film to be tested, the known testing machines are limited to the testing of small magnetic films and do not always make it possible to carry out continuous tests.

Thus, the presently available machines generally require the prior cutting of layers with a large surface area, called wafers, into small portions each carrying an elementary device called chips. Each chip which is to be placed in a field application box having more particularly cylindrical shielding and permanent magnets must then be equipped with control and/or output conductors before being placed in the "test box" provided with sets of polarization coils and of rotary field suitable for placing the same under operating conditions, whilst the conductors are connected to the test electronics. Thus, all the operations corresponding to a complete test are performed on each good or bad chip.

BRIEF SUMMARY OF THE INVENTION

The object of the present invention is to provide a machine for testing planar magnetic films with magnetic bubbles permitting the continuous testing of large planar magnetic films which can for example reach a diameter of 10 cm and permitting an easy access to the magnetic film to be tested, as well as a visual display of the testing operations. The display makes it possible to check the correct installation of the testing device, such as a testing device with points, together with the continuity of the conductors and also makes it possible to observe the displacement of a magnetic domain by the Kerr effect when the magnetic form has a reflecting coating on its lower face. Moreover, according to the invention, the component normal to the plane of the magnetic film of the rotary field created by the magnetic head never exceeds 2% of said field, which makes it possible not to interfere with the operation of the element to be tested.

The invention therefore relates to a machine for testing planar magnetic film with magnetic bubbles and which comprises a testing device and a magnetic head, wherein the magnetic head incorporates two polarization coils in the Helmholtz position and whereof the common axis is normal to the plane of the magnetic film and two flat coils whose axes are perpendicular to one another and parallel to the plane of the magnetic film, the first of the polarization coils being arranged within the flat coils which are themselves arranged one within the other and on the same side of the magnetic film, whilst the test device and the second polarization coil are arranged on the other side of the magnetic film.

Due to the special arrangement of the coils, constituting the magnetic head according to the invention and the arrangement of the testing device in respect of said coils the testing machine according to the invention makes it possible to achieve the objectives referred to hereinbefore, whilst having magnetic characteristics which meet the demands made on such machines. The machine according to the invention more particularly makes it possible to carry out static tests (checking the continuity and resistance of conductors) and dynamic tests (checking the continuity of bubble propagation chains and their good propagation) on the complete wafer.

According to another feature of the invention the magnetic head also comprises shielding placed within the flat coils on the side of the first polarization coil opposite to the magnetic film. This shielding eliminates the horizontal component of the rotary field due to the portion of the flat coils opposite to the magnetic film by image effect.

According to another feature of the invention the two flat coils and the first polarization coil are arranged within a tightly sealed case in which circulates a fluid with a high dielectric constant. This arrangement ensures the cooling of the coil and the stabilization of the temperature to the desired value.

According to a second feature of the invention the testing machine also comprises a thin plate arranged between the flat coils on the one hand and the testing device and the second polarization coil on the other, said thin plate being normal to the axis of the polarization coils and moveable in its plane so as to support the magnetic film and permit the continuous testing of the latter. In this case the machine preferably comprises a depression device by means of which the magnetic film is maintained on the thin plate.

According to a special embodiment of the invention the testing device comprises a card with points carried by a support which can move in a direction normal to the plane of the magnetic film. The machine then preferably has means for lifting the support providing access to the thin plate supporting the magnetic film.

According to another feature of the invention the testing machine also comprises display means arranged along the common axis of the polarization coils on the same side as the magnetic film and the second polarization coil.

According to another feature of the invention the testing machine also comprises means for regulating the height and adjusting the magnetic head.

The invention also relates to a method for testing magnetic films with magnetic bubbles incorporating a plurality of elementary memories with magnetic bubbles, wherein each of the elementary memories is sequentially analyzed by means of the testing machine defined hereinbefore and wherein each of the elementary memories is cut from the magnetic film and wherein the defective elementary memories are eliminated before, if necessary, carrying out other individual tests on each of the remaining elementary memories.

DESCRIPTION OF THE DRAWINGS AND PREFERRED EMBODIMENTS

A non-limitative embodiment of the invention will now be described with reference to the attached drawing which shows in cross-sectional, diagrammatic manner a testing machine according to the present invention.

The testing machine shown in the drawing comprises an anti-vibratory support frame 10, shown by dot-dash lines, on which is mounted a table 12 by using per se known means permitting the displacement of said table at X and Y perpendicular directions in a horizontal plane, said means being designated by the reference numeral 14. Table 12 carries a thin rigid plate 16 arranged in a horizontal plane and whose central portion is provided with a recess 18 in which is disposed the flat magnetic film having magnetic bubbles 20 which it is desired to test. Preferably film 20 is maintained on plate 16 by a not shown depression device, whose suction orifices issue into the recess 18.

According to the invention the thin plate 16 is fixed to support 12 by its two ends, so as to define between frame 10 and plate 16 a space in which is received a tightly sealed case 22 supported by frame 10. The tightly sealed case 22 contains two flat coils 24 and 26 fitted into one another and whose axes are perpendicular to one another and parallel to the plane of magnetic film 20. The flat coils 24 and 26 serve to create the rotary field necessary for the displacement of the magnetic domains within the film 20.

The first polarization coil 28, whose axis is normal to the plane of magnetic film 20, is arranged within the coils 24 and 26 within the vicinity of the layers thereof which are closest to film 20. Magnetic shielding 30 is arranged within the coils 24 and 26 and between coil 28 and the layers of coil 24 and 26 which are furthest from magnetic film 20. Preferably coil 28 and shielding 30 are separated by shims 32. A second polarization coil 34, identical to coil 28, is arranged outside the tightly sealed case 22 above plate 16, in such a way that the magnetic film 20 to be tested is positioned so as to be substantially equidistant from coils 28 and 34. The latter are arranged in a Helmholtz position and their common axis is normal to the plane of film 20. The polarization coils 28 and 34 serve to create a polarization field normal to the plane of film 20.

The flat coils 24 and 26 on the one hand and the polarization coils 28 and 34 on the other, as well as shielding 30, define the magnetic head of the testing machine according to the invention.

Preferably the flat coils 24 and 26 are constituted by two layers of Litz or multiple-stranded wires. The coils are then formed from weldable wires which are insulated from one another, made for example from enamelled copper. These wires are stranded together and the system of coils is then protected by one or two natural silk coverings. The Litz wire has a larger surface area for an identical diameter than a single-stranded wire. This makes it possible to reduce the skin effect and the losses resulting therefrom at the operating frequency, as well as the capacitance distributed between the two coils in such a way that the frequency rise is facilitated.

The shielding 30, which serves to reinforce the magnetic field created by the flat coils 24 and 26 at the level of the magnetic film 20 by image effect and to eliminate the horizontal component of said field due to the lower layers of coils 24 and 26, is preferably made from soft or mild ferrite of manganese and zinc with a high permeability and low losses. The thickness of shielding 30 is determined, whilst taking account both of the efficiency and its saturation point by the rotary field created by coils 24 and 26. A compromise between these two magnitudes leads to the limitation of the shielding thickness to a maximum of 3 mm.

Preferably the dimensions of the layers of coils 24 and 26 are calculated in such a way that the vertical component of the rotary field created by the coils is below 2% of the maximum field applied to the largest surface area liable to be occupied by a contacted piece of the magnetic film 20. Thus, tests have shown that this percentage represents the admissible limit to the vertical component value, below which the operation of the element with magnetic bubbles is not disturbed. The maximum surface area occupied by a contacted piece is equal to $10 \times 10$ mm, so that the size of the layers of coils 24 and 26 is fixed at $120 \times 120$ mm.

Due to the powers dissipated in flat coils 24 and 26 and in coil 28, which are respectively approximately 40 watts and 12 watts, it is necessary to cool these coils. Therefore a liquid with a high dielectric constant circulates in the tightly sealed case 22 between an inlet 36 and an outlet 38. This cooling liquid maintains the temperature at a constant level, no matter what power level is dissipated by the coils.

According to the invention the testing machine also comprises a testing device diagrammatically indicated at 40. It is for example a testing device with points incorporating removeable cards, whose points 42 are connected to an external electronic testing system (not shown) able to apply the voltages or currents necessary for the tests and measure the characteristic operating signals. The points 42 can be brought into contact with conductive contact pieces formed on the magnetic film 20 to be tested. Therefore testing device 40 can move quickly with respect to the magnetic film 20 between a position of contact between points 42 and the contact pieces formed on film 20, a low position close to the contact position and making it possible to effect the displacement of X and Y of plate 16 by means of device 14 and a high position giving access to film 20, so that in particular it can be replaced by another film to be tested. For this purpose the machine according to the invention has a plate 44 on which is received the testing device 40. Plate 44 is connected to the support frame 10 by lifting means constituted in the present embodiment by an articulation 46 located substantially in the plane of film 20, so as to effect a displacement of device 40 substantially normal to the latter in the vicinity of film 20. As is shown by the drawing plate 44 also supports the polarization coil 34.

As a result of the arrangement described hereinbefore the testing machine according to the invention makes it possible to continuously test large magnetic films with bubbles 20, while permitting an easy access to said film and whilst permitting a visual display of the points 42 of testing device 40 and the central portion of film 20 due to display means 48 constituted, for example, by a microscope, a camera and a monitor. These display means 48 are arranged along the common axis of the polarization coils 28 and 34 and on the same side of magnetic film 20 as coil 34. They make it possible to simultaneously check the efficiency of contact between points 42 and the contact pieces formed on film 20, check the continuity of the conductors and finally absorb the displacement of the magnetic domains by the Kerr effect when film 20 has a reflecting coating on its lower surface. The latter possibility makes it possible to observe deformations of the magnetic domains and particularly variations in their diameters as a function of the amplitude of the field and the position relative to the centre of the coils. Thus, it is possible to know the evolution of the vertical component of the magnetic field and more particularly to verify that the latter remains below 2% of the value of the field.

The testing machine according to the invention may also comprise a device for regulating the height and adjusting the tightly sealed case 22 incorporating the lower portion of the magnetic head, but said device is not shown in the drawing. The device makes it possible to perfectly regulate the position of the upper plane of coils 24, 26 and 28 relative to the plane defined by the film to be tested 20.

Magnetic film 20 constitutes a complete wafer having a certain number of elementary chips. Each chip has a certain number of excess registers. When film 20 is tested in the machine described hereinbefore it is firstly used for testing the number of registers of each chip in the operating state. When the number of defective registers exceeds the number of excess registers the chip is defective. It is then identified and marked, so that it can be eliminated by cutting out.

The remaining chips then individually undergo a temperature test (sampling method). Only the chips found to be satisfactory undergo the following tests (measurement of the operating magnetic field). Finally the operating zone or margin of each chip is determined.

Thus, the machine according to the invention makes it possible to rapidly and automatically sort the unsatisfactory chips in the wafer, so that all the tests do not need to be carried out on said defective chips. Due to the use of the device with points 42 the machine also eliminates the necessity of vetting the chips before testing.

Obviously the invention is not limited to the embodiment described and represented and various variants are possible. Thus, the means 14 permitting the displacement of plate 16 to which is fixed the magnetic film 20 to be tested can be constituted by other known means permitting an accurate displacement at X and Y. Articulation 46, which tilts plate 44 so as to give easy access to the film to be tested can be replaced by any known means permitting the displacement of test device 40 vertically with respect to the plane of film 20. Test device 40, which in the represented embodiment is constituted by a device having points, can also be constituted by any other known device which can be connected to an external electronic testing system of a random type.

What is claimed is:

1. A machine for testing planar magnetic film with magnetic bubbles, said machine comprising support means carrying a testing device and a magnetic head, wherein the magnetic head incorporates two polarization coils and two flat coils, said polarization coils being in the Helmholtz position and having a common axis normal to the plane of the magnetic film, the axes of said flat coils being perpendicular to one another and parallel to the plane of the magnetic film, a first of the polarization coils being arranged within the flat coils which are themselves arranged one within the other and on the same side of the magnetic film, whilst the testing device and the second polarization coil are arranged on the other side of the magnetic film.

2. A testing machine according to claim 1, wherein the magnetic head also comprises a shielding arranged within the flat coils between said first polarization coil and layers of said flat coils which are furthest from the magnetic film.

3. A testing machine according to claims 1 or 2, wherein the two flat coils and the first polarization coil are arranged within a tightly sealed case in which a fluid with a high dielectric constant is adapted to circulate.

4. A testing machine according to claim 1, wherein it also comprises a thin plate positioned between said flat coils on the one hand and the testing device and second polarization coil on the other, said thin plate being normal to the axis of the polarization coils and moveable in the plane thereof so as to support the magnetic film.

5. A testing machine according to claim 4, wherein it also comprises a depression device by means of which the magnetic film is maintained on the thin plate.

6. A testing machine according to claim 1, wherein the testing device comprises a card with points, said card being carried by a support on said support means which can move in a direction substantially normal to the plane of the magnetic film.

7. A testing machine according to claim 6, including means for movably mounting said support to permit it to be lifted so as to give access to the magnetic film.

8. A testing machine according to claim 1, wherein it also comprises visual display means arranged along the common axis of the polarization coils on the same side of the magnetic film as the second polarization coil.

9. A testing machine according to claim 6, wherein said support also carries said second polarization coil.

* * * * *